(12) United States Patent
Song

(10) Patent No.: US 11,609,605 B2
(45) Date of Patent: Mar. 21, 2023

(54) FOLDING FRAME AND FOLDABLE DISPLAY

(71) Applicant: LG Display Co., Ltd., Seoul (KR)

(72) Inventor: Eunah Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 70 days.

(21) Appl. No.: 17/003,510

(22) Filed: Aug. 26, 2020

(65) Prior Publication Data

US 2021/0064083 A1  Mar. 4, 2021

(30) Foreign Application Priority Data

Aug. 30, 2019 (KR) .......... 10-2019-0107593

(51) Int. Cl.
| | |
|---|---|
| *G06F 1/16* | (2006.01) |
| *H01L 51/52* | (2006.01) |
| *H01L 51/00* | (2006.01) |
| *H01L 21/70* | (2006.01) |

(52) U.S. Cl.
CPC .......... *G06F 1/1616* (2013.01); *G06F 1/1641* (2013.01); *G06F 1/1652* (2013.01); *H01L 21/705* (2013.01); *H01L 51/0097* (2013.01); *H01L 51/5256* (2013.01)

(58) Field of Classification Search
CPC .... G06F 1/1616; G06F 1/1652; G06F 1/1641; H01L 21/705; H01L 51/0097; H01L 51/5256; H01L 27/3244; H01L 2251/558; H01L 2251/5338; Y02E 10/549; G09F 9/301
See application file for complete search history.

(56) References Cited

U.S. PATENT DOCUMENTS

| | | | |
|---|---|---|---|
| 9,886,063 B2 | 2/2018 | Yoo | |
| 9,923,156 B2 | 3/2018 | Jeong | |
| 10,909,889 B2* | 2/2021 | Lee | ........................ G06F 1/1652 |
| 2009/0021666 A1* | 1/2009 | Chen | ................. G02F 1/133305 |
| | | | 349/58 |

(Continued)

FOREIGN PATENT DOCUMENTS

| | | |
|---|---|---|
| CN | 106373490 A | 2/2017 |
| CN | 106409149 A | 2/2017 |

(Continued)

OTHER PUBLICATIONS

Office Action dated May 12, 2022, issued in corresponding Chinese Patent Application No. 202010877612.4.

(Continued)

*Primary Examiner* — Abhishek M Rathod
(74) *Attorney, Agent, or Firm* — Morgan, Lewis & Bockius LLP

(57) ABSTRACT

The present disclosure relates to a folding frame for a foldable display and a foldable display. A folding frame for a foldable display may include: a reference plane; a first folding plane disposed at one side of the reference plane; a second folding plane disposed at another side of the reference plane; a first bending part disposed between the reference plane and the first folding plane and having a first bending radius; and a second bending part disposed between the reference plane and the second folding plane and having a second bending radius, wherein the first folding plane is thinner than the reference plane.

25 Claims, 4 Drawing Sheets

(56) References Cited

U.S. PATENT DOCUMENTS

| | | | |
|---|---|---|---|
| 2015/0062525 A1* | 3/2015 | Hirakata | G02F 1/133305 |
| | | | 349/158 |
| 2015/0227224 A1* | 8/2015 | Park | G06F 1/1677 |
| | | | 345/173 |
| 2015/0351232 A1* | 12/2015 | Cok | H05K 1/0274 |
| | | | 156/204 |
| 2017/0045914 A1* | 2/2017 | Namkung | G02F 1/133305 |
| 2017/0064845 A1* | 3/2017 | Jung | H05K 1/181 |
| 2018/0182829 A1* | 6/2018 | Shin | G06F 1/1652 |
| 2019/0086059 A1* | 3/2019 | Hirakata | F21V 15/012 |
| 2019/0320048 A1* | 10/2019 | Yang | H04M 1/0247 |
| 2020/0168821 A1* | 5/2020 | Cao | G06F 1/1637 |
| 2020/0251025 A1* | 8/2020 | Li | G09F 9/30 |
| 2021/0053319 A1 | 2/2021 | Xie et al. | |

FOREIGN PATENT DOCUMENTS

| | | |
|---|---|---|
| CN | 206400960 U | 8/2017 |
| CN | 109448553 A | 3/2019 |

OTHER PUBLICATIONS

Office Action dated Aug. 26, 2022, issued in corresponding Chinese Patent Application No. 202010877612.4.

* cited by examiner

FOLDING FRAME AND FOLDABLE DISPLAY

CROSS-REFERENCE TO RELATED APPLICATIONS

This application claims the priority benefit of the Korean Patent Application No. 10-2019-0107593 filed in the Republic of Korea on Aug. 30, 2020, the entire contents of which is hereby expressly incorporated by reference as if fully set forth herein into the present application.

BACKGROUND

Field of the Invention

The present disclosure relates to a folding frame for a foldable display and a foldable display. Especially, the present disclosure relates to a folding frame and a foldable display which may be folded in three steps to have a G-shape.

Discussion of the Related Art

As the information society develops, the demands for display apparatus are also developing in various manners. For example, various flat panel display apparatus such as a liquid crystal display (or LCD), and organic light emitting display (or OLED), and a mirco LED display have been developed.

In particular, a foldable display or a rollable display having a flexible display panel that can be bent or foldable is spotlinghted as the next generation technology due to the advantage of being able to provide a display area of large screen while maintaining the convenience of carrying. The flexible display may be applied to portable electric devices such as the mobile communication terminals, the electronic notebooks, the e-books, the portable multimedia players (PMPs), the untra mobile PCs (UMPCs), the mobile phones, the smart phones, and the tablet PCs (Personal Computers). Further, it can be applied to other various fields such as the television sets, the monitors and the instrument panels for automobiles.

A foldable display that folds to have a small area when carrying it, and unfold to have a wide display area when using it may be damaged easily than other display because it may be repeatedly folded and unfolded several times. Therefore, it is necessary to structurally improve by reducing the folding stress and/or bending stress caused by repeating the folding and unfolding operations so that no damage occurs even using for a long time.

SUMMARY

Accordingly, embodiments of the present disclosure are directed to a folding frame and a foldable display that substantially obviate one or more of the problems due to limitations and disadvantages of the related art.

The purpose of the present disclosure, as for solving the problems described above, is to provide a foldable display that can be folded to have a small size when not used, which is advantageous for carrying and storage, and can be expanded to provide a wide display area when used. The another purpose of the present disclosure is to provide a foldable display having a structure in which the damages caused by the bending and/or folding stress according to the repeated folding-unfolding operation is minimized. The still another purpose of the present disclosure is to provide a foldable display having a structure for relifing the folding and/or bending stresses at the bending portions having different bending radius as folded in a G-folding manner.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a folding frame for a foldable display comprises: a reference plane; a first folding plane disposed at one side of the reference plane; a second folding plane disposed at another side of the reference plane; a first bending part disposed between the reference plane and the first folding plane and having a first bending radius; and a second bending part disposed between the reference plane and the second folding plane and having a second bending radius, wherein the first folding plane is thinner than the reference plane.

In one example, the folding frame further includes: an upper surface having flat condition; and a lower surface parallel with the upper surface and having level differences, wherein the back plate is attached to the upper surface with an optical adhesive.

In one example, the first folding plane is thinner than the second folding plane.

In one example, the first folding plane is eqault to or thinner than the first thickness, and the second folding plane is equal to or thicker than the second thickness.

In one example, the first folding plane is thinner than the first thickness, the reference plane is thicker than the first thickness, the second thickness is thicker than the reference plane, and the second folding plane is thickener than the second thickness.

In one example, a thickness of the first folding plane is equal to the first thickness, a thickness of the reference plane is equal to the second thickness, and the second folding plane is thicker than the second thickness.

In one example, a thickness of the first folding plane is equal to the first thickness, and thicknesses of the reference plane and the second folding plane are equal to the second thickness.

In one example, a thickness of the the first folding plane is equal to the first thickness, a thickness of the second folding plane is equal to the second thickness, and the reference plane is thicker than the second thickness.

In one example, the first folding plane, the reference plane and the second folding plane are thicker than the first thickness and the second thickness.

In one example, the first folding plane is folded over the reference plane, and the second folding plane is folded over the first folding plane.

In another aspect, a foldable display comprises: a folding frame including: an upper surface being coplanar; a lower surface parallel to the upper surface and having level differences; a first bending part having a first width on the lower surface; a second bending part being apart from the first bending part and having a second width larger than the first width on the lower surface; a reference plane between the first bending part and the second bending part; a first folding plane expanded from the first bending part to opposite side of the reference plane; and a second folding plane expanded from the second bending part to opposite side of the reference plane, wherein the reference plane is thicker than the first folding plane and the first bending part, and wherein the second folding plane is thicker than the first folding plane and the first bending part.

In one example, the foldable display further comprises: a back plate disposed on the upper surface of the folding frame; a flexible substrate disposed on the back plate; a display layer disposed on the flexible substrate; an encapsulation layer covering the display layer; and a cover film disposed on the encapsulation layer.

In one example, a thickness of the second bending part is equal to or thicker than the first bending part.

In one example, a thickness of the first folding plane is equal to or thinner than the first bending part, and a thickness of the second folding plane is equal to or thicker than the second bending part.

In one example, the first folding plane is thinner than the first bending part, the reference plane is thicker than the first bending part, the second bending part is thicker than the reference plane, and the second folding plane is thicker than the second bending part.

In one example, a thickness of the first folding plane is equal to the first bending part, a thickness of the reference plane is equal to the second bending part, and the second folding plane is thicker than the second bending part.

In one example, a thickness of the first folding plane is equal to the first bending part, and thicknesses of the reference plane and the second folding plane are equal to the second bending.

In one example, a thickness of the first folding plane is equal to the first bending part, a thickness of the second folding plane is equal to the second bending part, and the reference plane is thicker than the second bending part.

In one example, the first folding plane, the reference plane and the second folding plane are thicker than the first bending part and the second bending part.

In one example, the first bending part is bent and the first folding plane is folded over the reference plane, and the second bending part is bent and the second folding plane is folded on the first folding plane.

The foldable display apparatus according to the present disclosure has a first bending part and a second bending part, and implements the G-folding structure, thereby minimizing the size when folded and maximizing the size when unfolded. The foldable display according to the present disclosure may have a G-folding structure including at least two folding areas having different radii of curvatures, and may minimize the stress caused from the repeated folding and unfolding operations at then bending portions by providing different thickness to the bending portions having different radii of curvatures. In detail, by providing different thicknesses to the bending portions having different curvatures and the flat portions extended thereto, the neutral plane (or neutral surface) are positioned differently according to the curvature, thereby minimizing the damage by the repeated bending operations.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION

Figure 1A:
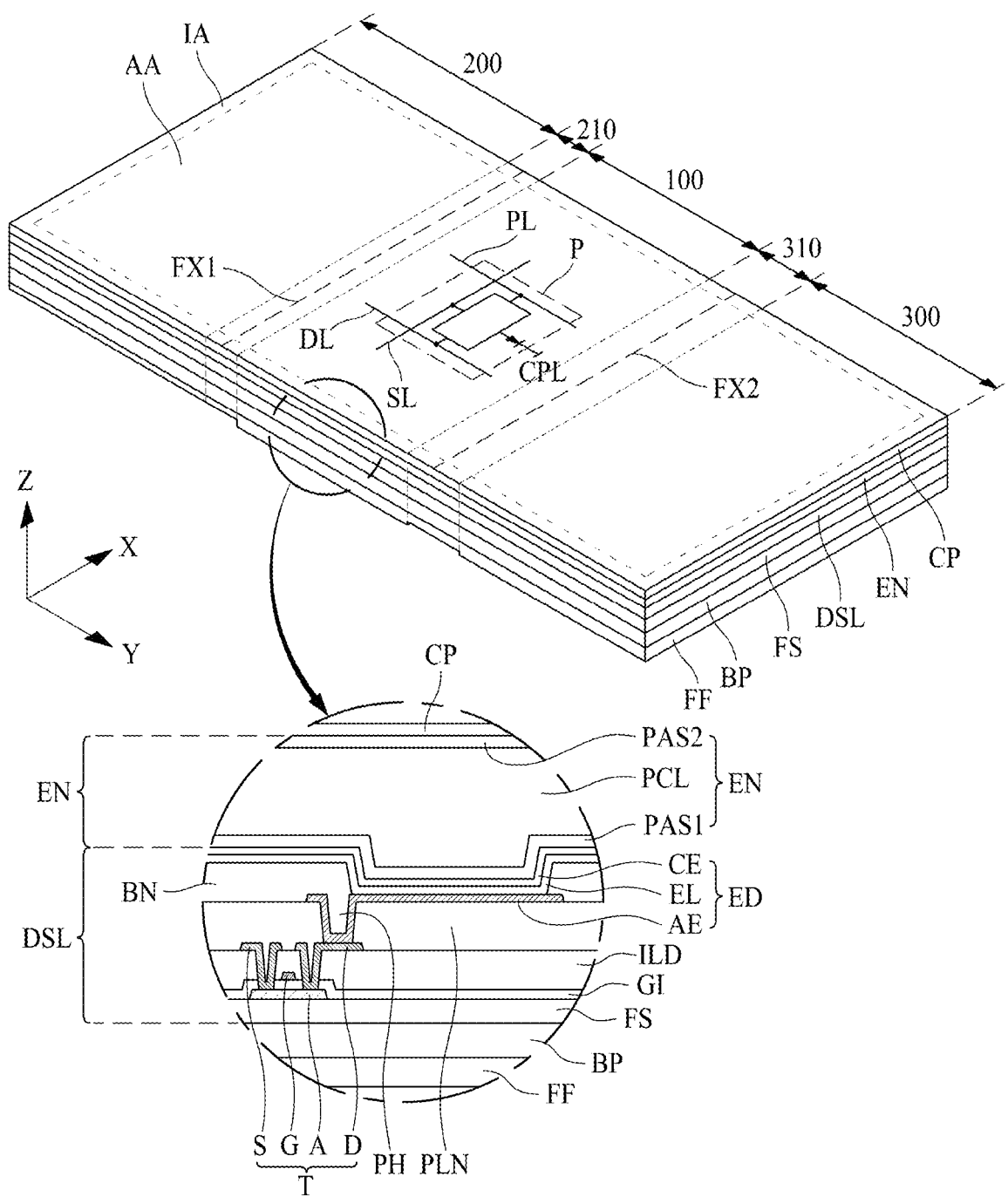
FIG. 1A is a perspective view illustrating a fully unfolded state of a foldable display according to the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case that "comprise," "have," and "include" described in the present specification are used, another part may also be present unless "only" is used. The terms in a singular form may include plural forms unless noted to the contrary.

In construing an element, the element is construed as including an error range although there is no explicit description.

In describing a positional relationship, for example, when the positional order is described as "on," "above," "below," and "next," the case of no contact there-between may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X axis direction", "Y axis direction" and "Z axis direction" may not be interpreted only as a geometric relationship in which the relationship between each other is perpendicular, and may mean that the configuration of the present disclosure has a wider scope to the extent that it may functionally work.

In describing the elements of the present disclosure, terms such as the first, the second, A, B, (a) and (b) may be used. These terms are only to distinguish the elements from other elements, and the terms are not limited in nature, order, sequence or number of the elements. When an element is described as being "linked", "coupled" or "connected" to another element that element may be directly connected to or connected to that other element, but indirectly unless otherwise specified. It is to be understood that other elements may be "interposed" between each element that may be connected to or coupled to.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

The display panel according to the embodiments of the present disclosure may include a liquid crystal display panel, an organic light emitting diode display panel, and an electroluminescent display panel, but it is not limited thereto. In addition, the display panel applied to the display apparatus according to the embodiment of the present disclosure is not limited to the shape or size of the display panel.

Hereinafter, an example of a display apparatus according to the present disclosure will be described in detail with reference to the accompanying drawings. In designating reference numerals to elements of each drawing, the same components may have the same reference numerals as much as possible even though they are shown in different drawings. Scale of the elements shown in the accompanying drawings have a different scale from the actual for convenience of description, it is not limited to the scale shown in the drawings.

Figure 1B:
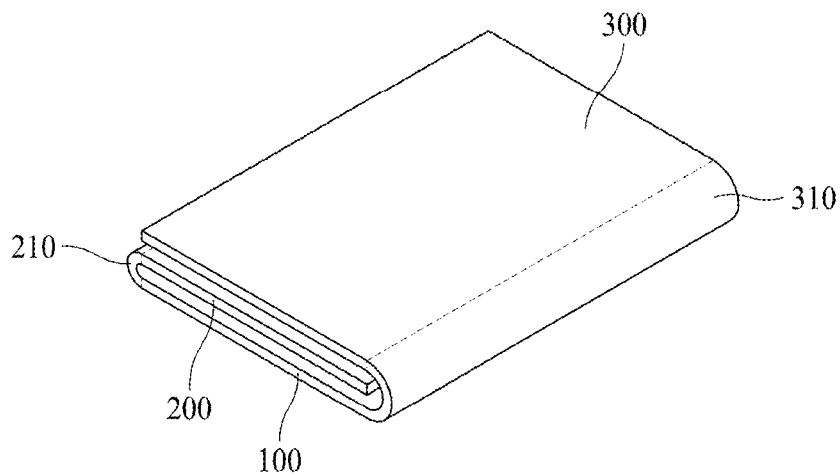
FIG. 1B is a perspective view illustrating a folded state in a G-folding manner of a foldable display according to the present disclosure.

Hereinafter, referring to FIGS. 1A and 1B, a structure of the foldable display according to the present disclosure will be explained. FIG. 1A is a perspective view illustrating a fully unfolded state of a foldable display according to the present disclosure. FIG. 1B is a perspective view illustrating a folded state in a G-folding manner of a foldable display according to the present disclosure.

Referring to FIGS. 1A and 1B, a foldable display according to the present disclosure may be a display in which it is easy to carry, store and move in a small size by folding a specific portion of the display, and it provide a wide display area by unfolding in a large area when using the display. In one example, the foldable display may be formed such that the central portion of the display panel may be folded and unfolded in half. In another example, the foldable display may be implemented by a double folding type in which the ⅓ point line and the ⅔ point line may be folded in the longitudinal direction of the display panel.

In detail, the G-folding type foldable display may be implemented by that a first ⅓ part of the display panel may be bent upward with respect to the ⅓ point line of the display panel, and a second ⅓ part of the display panel may be bent upward with respect to the ⅔ point line of the display panel, so that the second ⅓ part may be folded over the first ⅓ part. For another example, even though it is not described in this disclosure, a Z-folding type foldable display may be implemented by that a first ⅓ part of the display panel may be bent upward with respect to the ⅓ point line of the display panel, and a second ⅓ part of the display panel may be bent downward with respect to the ⅔ point line of the display panel.

It will be described with reference to FIG. 1A. A G-folding type foldable display may comprise a flexible substrate FS, a displaying layer DSL, an encapsulation layer EN, a cover film CP and a back plate BP, in a cross-sectional view. Further, the G-folding type foldable display may comprise a reference plane 100, a first folding plane 200, a second folding plane 300, a first bending part 210 and a second bending part 310.

At first, the planar structure will be briefly described. The reference plane 100 may be a reference region defined in the central area of the display which is always in the same state whether folded or unfolded. The first folding plane 200 and the second folding plane 300 may be folded upward over the reference plane 200 under the folded state, and may be disposed at the left side and the right side of the reference plane 200, respectively to form a flat plane with the reference plane 200 under the unfolded state. The first bending part 210 may be a region that is bent in a semicircle shape when the first folding plane 200 is folded. The second bending part 310 may be a region that is bent in a semicircle shape when the second folding plane 300 is folded.

Hereinafter, the structure of the foldable display according to the present disclosure will be described in detail in the cross-sectional view. The flexible substrate FS may be made of a plastic material such as a polyimide and may be formed in a thin film type, so that the display elements formed thereon may be damaged by the moisture and/or oxygen intruding through the flexible substrate FS. In the present disclosure, attaching a back plate BP made of a material having a property of preventing moisture and oxygen, i.e., including a styrene-isobutylene copolymer, on the lower surface of the flexible substrate FS, the damage to the display element may be prevented. The flexible display may be completed by attaching the back plate BP having a flexible property while maintaining a certain degree of strength on the lower surface of the flexible substrate FS where a glass substrate was disposed before and removed later. It is preferable that the back plate BP may be made of a flexible material having the elasticity to maintain the flatness of the display. Further, it is preferable that the back plate BP may be a film type having a constant thickness.

The present disclosure relates to a foldable display, so it is preferable that a specific part of the display may be folded and unfolded freely. Therefore, a folding frame FF may be assembled under the back plate BP. For example, using an optical adhesive (not shown), the lower surface of the back plate BP may be attached to the upper surface of the folding frame FF.

The foldable display according to the present disclosure may be completed by thinning some portions where the display panel is bent, after forming a flexible display. For example, some parts of the folding frame FF corresponding to the folding part of the foldable display panel may be removed to implement the folding operation. The thickness of the folding frame FF may be thinned by removing some portions of the rear surface at the first bending part 210 and the second bending part 310. In one example, when the bending curvature of the first bending part 210 is smaller than the bending curvature of the second bending part 310, it is preferable that the thickness of the first bending part 210 of the display may be thinner than the thickness of the second bending part 310 of the display.

The display layer DSL may include a plurality of display elements formed on the upper surface of the flexible substrate FS. For example, after forming the driving elements includes thin film transistors, the organic light emitting elements including organic light emitting layer may be stacked thereon.

On the display layer DSL an encapsulation layer EN may be formed for protecting the organic light emitting elements. The encapsulation layer EN may have a three layered structure in which an inorganic layer, an organic layer and an inorganic layer are sequentially stacked.

The cover film CP may be an outermost layer stacked on the encapsulation layer EN. The cover film CP may be a protection layer for protecting the display from the environment. The cover film CP may further include a polarization element for eliminating the reflection of external lights.

The folding frame FF may be attached under the back plate BP. Further, an optical adhesive (not shown) may be inserted between the back plate BP and the folding frame FF. The folding frame FF may be a supporting member for ensuring the folding operation of the foldable display. For example, the folding frame FF may be made of a material having less modulus value than the back plate BP.

Although the folding frame FF may be made of material having a relatively low modulus for ensuring the folding function, the display may be back into a flat state when the display changed to the unfolded because the modulus of the back plate BP is higher than the folding frame FF. In other words, the folding frame FF may be a supporting member for ensuring the folding function and the back plate BP may be a supporting member for allowing the display to return to a flat state.

The structure of the flexible display for implementing the foldable display will be described in detail. The flexible display may include a display area AA and a non-display area IA. The display area AA may be provided at the middle portions of the display and defined as an area for representing the video information. The non-display area IA surrounding the display area AA may be defined as an area not presenting video information or an circumference area.

The display area AA may include a plurality of pixels P arrayed in a matrix manner. The pixel P may be defined by a scan line SL, a data line DL and a pixel driving power line PL.

The scan lines SL may be extended along a first direction (X-axis) and arrayed with a predetermined distance along a second direction (Y-axis). The display area AA of the flexible substrate FS may include a plurality of scan lines SL which are parallel with the first direction (X-axis) and arrayed along the second direction (Y-axis) with certain distance. Here, the first direction (X-axis) may be defined the lateral (or horizontal) direction on the flexible substrate FS, and the second direction (Y-axis) may be defined the portrait (or vertical) direction on the flexible substrate FS. However, it is not limited thereto, and they are defined vice versa.

The data lines DL may be extended along the second direction (Y-axis) and arrayed with a predetermined distance along the first direction (X-axis). The display area AA of the flexible substrate FS may include a plurality of data lines DL which are parallel with the second direction (Y-axis) and arrayed along the first direction (X-axis) with certain distance.

The pixel driving power line PL may be disposed on the flexible substrate FS as being parallel with the data line DL. The display area AA of the flexible substrate FS may include a plurality of pixel driving power lines PL parallel with the data lines DL. In some cases, the pixel driving power line PL may be disposed as being parallel with the scan line SL. The pixel P may include a pixel circuit PC electrically connected to the scan line SL, the data line DL and the pixel driving power line PL, and an emission element ED electrically connected to the pixel circuit PC.

The pixel circuit PC may control the electric current Ted flowing to the emission element ED from the pixel driving power line PL according to the data voltage supplied from the data line DL by responding to the scan signal supplied from the scan line SL.

The emission element ED may be operated by the data current Ted supplied from the pixel circuit PC to emit the lights having a brightness (or luminescence) corresponding to the data current Ted. In this case, the data current Ted may flow from the pixel driving power line PL to the common power line CPL via the driving thin film transistor and the emission element ED.

The common power line CPL may be disposed at the non-display area IA of the flexible substrate FS, and electrically connected to the common electrode disposed on the display area AA. Hereinafter, the cross-sectional structure of the display will be explained.

A buffer layer (not shown) may be further formed on the upper surface of the flexible substrate FS. The buffer layer may be formed on the upper surface of the flexible substrate FS for preventing the moisture from intruding into the display layer DSL through the flexible substrate FS vulnerable to moisture permeation. In one example, the buffer layer may include a plurality of inorganic layer alternately stacked. For example, the buffer layer may be have a multi-layered structure in which at least one inorganic layer including silicon oxide (SiOx) layer, silicon nitride (SiNx) layer and silicon oxynitride (SiON) layer are stacked alternately stacked. In some cases, the buffer layer may be not included.

The display layer DSL may include a thin film transistor layer, a planarization layer PLN, a bank BN and an emission element ED. The thin film transistor layer may be provided in the pixel P defined within the display area AA of the flexible substrate FS.

In one example, the thin film transistor layer may include a thin film transistor T, a gate insulating layer GI and an intermediate insulating layer ILD. Here, the thin film transistor T shown in FIG. 1a may be a driving thin film transistor electrically connected to the emission element ED.

The thin film transistor T may include a semiconductor layer A formed on the flexible substrate FS or buffer layer, a gate electrode G, a source electrode S and a drain electrode D. The thin film transistor T shown in FIG. 1a illustrates a top gate structure in which the gate electrode G is disposed over the semiconductor layer A, but it is not limited thereto. In another example, the thin film transistor T may have a bottom gate structure in which the gate electrode G is disposed under the semiconductor layer A, or a double gate structure in which two gate electrodes G are disposed under and over the semiconductor layer A, respectively.

The semiconductor layer A may be formed on the flexible substrate FS or the buffer layer. The semiconductor layer A may include one of a silicon-based semiconductor material, an oxide-based semiconductor material or an organic-based semiconductor material, and have a single-layered structure of a multi-layered structure. A light shielding layer (not shown) may be further included between the buffer layer and the semiconductor layer A for protecting the external light from intruding into the semiconductor layer A.

The gate insulating layer GI may be formed over the whole surface of the flexible substrate FS as covering the semiconductor layer A. The gate insulating layer GI may include an inorganic layer such as silicon oxide (SiOx) layer, silicon nitride (SiNx) layer or multi-layer of them.

The gate electrode G may be formed on the gate insulating layer GI as overlapped with the semiconductor layer A. The gate electrode G may be formed with the scan line SL. In one example, the gate electrode G may be formed of any one metal material including molybdenum (Mo), aluminum (Al), chromium (Cr), gold (Au), titanium (Ti), nickel (Ni), neodymium (Nd) and copper (Cu) or alloy of them in a single layer or in a multiple layer.

The intermediate insulating layer ILD may be formed on the whole surface of the flexible substrate FS as covering the gate electrode G and the gate insulating layer GI. The intermediate insulating layer ILD may provide a flat surface over the gate electrode G and the gate insulating layer GI.

The source electrode S and the drain electrode D may be formed on the intermediate insulating layer ILD as overlapped with the semiconductor layer A and at both sides of the gate electrode D, respectively. The source electrode S and the drain electrode D may be formed with the data line DL, the pixel driving power line PL and the common power line CPL. That is, the source electrode S, the drain electrode D, the data line DL, the pixel driving power line CPL and the common power line CPL may be formed at the same time by the patterning the source-drain material deposited on the intermediate insulating layer ILD.

The source electrode S and the drain electrode D may contact the semiconductor layer A via a contact hole penetrating the intermediate insulating layer ILD and the gate insulating layer GI. The source electrode S and the drain electrode D may be formed of any one metal material including molybdenum (Mo), aluminum (Al), chromium (Cr), gold (Au), titanium (Ti), nickel (Ni), neodymium (Nd) and copper (Cu) or alloy of them in a single layer or in a multiple layer. Here, the source electrode S of the thin film transistor T shown in FIG. 1 may be electrically connected to the pixel driving power line PL.

The thin film transistor T provided in the pixel P of the flexible substrate FS may configure the pixel circuit PC. The planarization layer PLN may be formed over the whole surface of the flexible substrate FS as covering the thin film transistor layer including the pixel circuit PC. The planarization layer PLN may provide a flat surface conduction over the thin film transistor layer. In one example, the planarization layer PLN may be formed of an organic layer such as acryl resin, epoxy resin, phenolic resin, polyamide resin or polyimide resin. In another example, the planarization layer PLN may include a pixel contact hole PH for exposing some portions of the drain electrode D of the driving thin film transistor disposed in the pixel P.

The bank BN may be disposed on the planarization layer PLN and define an aperture area (or emission area) within the pixel P disposed in the display area AA. The bank BN may be expressed as a 'pixel defining layer'.

The emission element ED may include a pixel driving electrode AE, an emission layer EL and common electrode CE. The pixel driving electrode AE may be formed on the planarization layer PLN and electrically connected to the drain electrode D of the driving thin film transistor via the pixel contact hole PH provided at the planarization layer PLN. In this case, the circumference edge area excepting most of middle portions of the pixel driving electrode AE defined as the aperture area of the pixel P may be covered by the bank BN. Covering the circumferences of the pixel driving electrode AE, the bank BN may defined the aperture area of the pixel P.

The pixel driving electrode AE according on example may include a metal material having high reflectiveness property. For example, the pixel driving electrode AE may be formed as a multiple layered structure such as titanium-aluminum stack (Ti/Al/Ti) structure, aluminum-ITO stack (ITO/Al/ITO) structure, APC alloy (Ag/Pd/Cu) structure and APC-ITO stack (ITO/APC/ITO) structure, or a single layered structure including at least one material including silver (Ag), aluminum (Al), molybdenum (Mo), gold (Au), magnesium (Mg), calcium (Ca) and barium (Ba) or alloy including at least two of them.

The emission layer EL may be formed at the whole surface of the display area AA of the flexible substrate FS as covering the pixel driving electrode AE and the bank Bn. In one example, the emission layer EL may include at least two emission portions vertically stacked for emitting the white light. For example, the emission layer EL may include a first emission portion and a second emission portion for emitting the white light by mixing a first color light and a second color light. Here, the first emission portion emitting the first color light may include any one of blue emission layer, green emission layer, red emission layer, yellow emission layer and yellow-green emission layer. The second emission portion may include an emission layer emitting the second color light having a complementary color relationship of the first light among the blue emission layer, green emission layer, red emission layer, yellow emission layer and yellow-green emission layer.

In another example, the emission layer EL may include any one of blue emission layer, green emission layer and red emission layer for emitting color light corresponding to the allocated at each pixel P. For example, the emission layer EL may include any one of organic light emission layer, inorganic light emission layer and quantum dot emission layer, or a multiple structure of organic light emission layer and quantum dot emission layer or mixing structure of them.

The common electrode CE may be formed as connecting the emission layer EL electrically. The common electrode CE may be formed on the whole surface of the display area AA of the flexible substrate FS as commonly connected to the emission layer EL provided at each pixel P.

In one example, the common electrode CE may include a transparent conductive material passing though the light or semi-transparent conductive material. In the case that the common electrode CE is made of semi-transparent conductive material, the light emission efficiency of light from the emission element may be improved by applying a micro cavity structure. In one example, the semi-transparent conductive material may include magnesium (Mg), silver (Ag) or alloy of magnesium and silver. In addition, a capping layer may be formed on the common electrode CE for enhancing the emission efficiency of the light by controlling the refractive index of the light emitted from the emission element.

A plurality of spacers (not shown) may be arrayed in the non-emission area where the emission element ED is not disposed in the display area AA. The spacer may be an element for preventing direct contact between the screen mask and the substrate in the process of depositing the emission layer EL. The spacer may be disposed on the bank BN so that the emission layer EL and the common electrode CE may be deposited as covering the spacers disposed within the display area AA. In some cases, the emission layer EL and/or the common electrode CE may not cover the spacers. As the spacers are disposed at some portions of the bank BN within the display area AA, even though the common electrode CE does not cover the spacers, the common electrode CE may be connected over the whole of the display area AA.

The encapsulation layer EN may be formed as covering the upper surface and the side surfaces of the display layer DSL. The encapsulation layer EN may play role of preventing the oxygen or moisture from intruding into the emission element ED.

In one example, the encapsulation layer EN may include a first inorganic layer PAS1, an organic layer PCL on the first inorganic layer PAS1 and a second inorganic layer PAS2 on the organic layer PCL. The first inorganic layer PAS1 and the second inorganic layer PAS2 may play role of preventing the moisture or oxygen from intruding thereinto. In one example, first inorganic layer PAS1 and the second inorganic layer PAS2 may include an inorganic material such as silicon nitride, aluminum nitride, zirconium nitride, titanium nitride, hafnium nitride, tantalum nitride, silicon oxide, aluminum oxide or titanium oxide. The first inorganic layer PAS1 and the second inorganic layer PAS2 may be formed by a chemical vapor deposition process or atomic layer deposition process.

The organic layer PCL may be surrounded by the first inorganic layer PAS1 and the second inorganic layer PAS2. The organic layer PCL may be formed as having relatively thicker thickness than the first inorganic layer PAS1 and the second inorganic layer PAS2 in order to adsorb and/or block particles that may occur during the manufacturing process. The organic layer PCL may be formed of an organic material such as silicon oxycarbon (SiOCz) acrylic or epoxy-based resin. The organic layer PCL may be formed by the ink jet coating process or the slit coating process.

The cover film CP may be disposed on the encapsulation layer EN over the flexible substrate FS. The cover film CP may be a topmost film for protecting whole elements formed there-under. Therefore, the cover film CP may have a size suitable for covering the display area AA and the non-display area IA.

The cover film CP may include an optical film (not shown). The optical film may be an element for preventing the color deterioration when the external light is reflected from the metal layer disposed in the display area AA. Therefore, it is preferable that the optical film may cover the whole area of the display area AA, at least.

Figure 2:
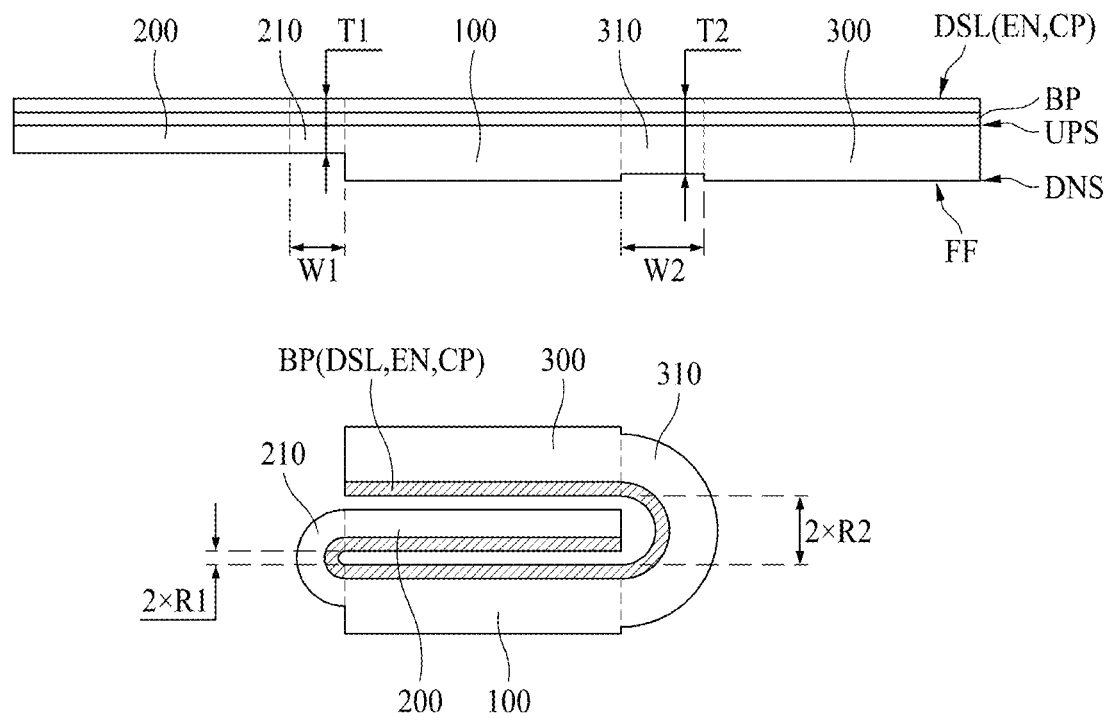
FIG. 2 is a side view illustrating a structure of a foldable display according to the present disclosure.

Hereinafter, referring to FIG. 2, the folding structure of the foldable display according to the present disclosure will be explained. FIG. 2 is a side view illustrating a structure of a foldable display according to the present disclosure. In the following description, the folding function will be mainly described. In FIG. 2, the upper drawing is a side view illustrating the fully folded state of the foldable display according to the present disclosure, and the lower drawing is a side view illustrating the G-folding state.

The foldable display according to the present disclosure may have a rectangular plate shape. The foldable display may have a G-folding structure. For example, the foldable display according to the present disclosure may include a reference plane 100, a first folding plane 200, a second folding plane, a first bending part 210 and a second bending part 310.

For example, the first bending part 210 may be defined at ⅓ portion of the lateral direction on the display. Further, the second bending part 310 may be defined at ⅔ portion of the lateral direction on the display. As shown in FIG. 1A, the first bending part 210 may be a region defined to be extended to both sides based on a first bending axis FX1. The second bending part 310 may be a region defined to be extended to both sides based on a second bending axis FX2.

The region between the first bending part 210 and the second bending part 310 may be defined as the reference plane 100. The outer region of the first bending part 210, that is an outer region disposed at the opposite side to the reference plane 100 based on the first bending part 210, may be defined as the first folding plane 200. In addition, the outer region of the second bending part 210, that is an outer region disposed at the opposite side to the reference plane 100 based on the first bending part 210, may be defined as the second folding plane 300.

The reference plane 100 may be a base region that does not relatively fold in the foldable display. The folding and unfolding operations may be relative, so it may not be defined that one region is absolutely fixed while only the other region is folded and unfolded. In describing this relative motion, the present disclosure defines a reference plane at the central region of the display.

The foldable display according to the present disclosure may be switched between the folded state and the unfolded state as the first bending part 210 and the second bending part 310 perform the folding and unfolding operations. In one example, as the first bending part 210 is folded, the first folding plane 200 may be in folded state over the reference plane 100. As the first bending part 210 is unfolded, the first folding plane 200 may be in unfolded state while forming the same plane with the reference plane 100.

With the same manner, as the second bending part 310 is folded, the second folding plane 300 may be in folded state over the reference plane 100. As the second bending part 310 is unfolded, the second folding plane 300 may be in unfolded state while forming the same plane with the reference plane 100.

Here, when both the first folding plane 200 and the second folding plane 300 are folded, the first folding plane 200 may be firstly folded over the reference plane 100, and then the second folding plane 300 may be folded over the back surface of the first folding plane 200. On the other hand, the second folding plane 300 may be firstly folded over the reference plane 100, and then the first folding plane 200 may be folded over the back surface of the second folding plane 300. The bending curvature (or radius) of the bending part varies depending on which folding plane is folded first. Therefore, in order to minimize damage as the folding and unfolding operations of the foldable display are repeated, it is preferable to set the folding plane to be folded first. In this disclosure, the first folding plane 200 is defined to be folded first, as shown in FIG. 2.

The first bending part 210 may include a first width W1 and a first thickness T1. Here, the first width W1 may be defined by the first bending radius R1 corresponding to the curvature of the first bending part 210. For example, when the first bending radius R1 is 4 mm, the first width W1 may be corresponding to half of the circumference length of the 4 mm radius circle. That is, the first width W1 may be 4 πmm. The first thickness T1 may be defined as a critical thickness that may absorb the folding stress or the bending stress when the back plate BP is folded with the first bending radius R1.

The second bending part 310 may have a second width W1 and a second thickness T2. Here, the second width W2 may be defined by the second bending radius R2 corresponding to the bending curvature of the second bending part 310. For example, when the second bending radius R2 is 6 mm, the second width W2 may be corresponding to half of the circumference length of the 6 mm radius circle. That is, the second width W2 may be 6 πmm. The second thickness T2 may be defined as a critical thickness that may absorb the folding stress or the bending stress when the back plate BP is folded with the second bending radius R2.

For example of G-folding structure, it is preferable that the first bending radius R1 may be smaller than the second bending radius R2. In other word, it is preferable that the first width W1 of the first bending part 210 may be smaller than the second width W2 of the second bending part 310. Further, it is preferable that the first thickness T1 may be thinner than the second thickness T2. In some cases, the first thickness T1 may be same with the second thickness T2. However, it is preferable that the first thickness T1 is not thicker than the second thickness T2.

In the G-folding structure according to the present disclosure, the first folding plane 200 is folded at first and then the second folding plane 300 is folded. The second bending radius R2 of the second bending part 310 may be larger than the first bending radius R1, and the the second bending part 310 is folded over the first folding plane 200. Therefore, it is preferable that the first folding plane 200 may be formed as having thin thickness as possible. For example, the first folding plane 200 may have thinner thickness than thicknesses of the reference plane 100 and the second folding plane 300.

Considering the manufacturing process, the folding frame FF may be supplied in a state in which a film having a relatively low modulus is wound in a roll form. After forming a folding fram FF by cutting as needed length from the film roll, the folding frame FF may be attached to the rear surface of the back plate BP.

Some portions of the thickness of the folding fram FF may be removed from the rear surface to form a desired thickness in the desired region. For example, at the first bending part 210, some thickness portions of the folding frame FF may be removed to have the first thickness T1 within the first width W1. At the second bending part 310, some thickness portions of the folding frame FF may be removed to have the second thickness T2 within the second width W2. In addition, the first folding plane 200 may be thinned to have thinner thickness than the reference plane 100 and the second folding plane 300. For example, the first folding plane 200 may be thinned at the processing for removing some thickness portions of the first bending part 210 to have the same thickness with the first bending part 210.

The description so far has focused on the case where the display is folded or unfolded. Therefore, the explanation is described in the view of the whole thickness of the display. It is one of the main features of the present disclosure that the thickness of the entire display has a different thickness for each region. In order to have different thickness in the display according to the present disclosure, the folding frame FF may be formed to have different thickness for each region. Therefore, hereinafter, the explanation will be described based on the folding frame FF. For example, the first thickness T1 and the second thickness T2 may be the thicknesses of the display in the above description. Hereinafter, the first thickness T1 and the second thickness T2 may be the thickness of the folding frame FF.

The folding frame FF according to the present disclosure may include an upper surface UPS and a lower surface DNS. The upper surface UPS may be a flat surface without any level difference, so all regions are coplanar. On the upper surface UPS, the back frame BP may be disposed. For example, using an optical adhesive (not shown), the folding frame FF may be attached on the bottom surface of the back plate BP which having the display layer DSL on the top surface.

The upper drawing in FIG. 2 illustrates the display layer DSL as embedding the encapsulation layer EN and the cover film CP and the back plate BP is shown as a separated element. However, the lower drawing in FIG. 2 illustrates the back plated BP as embedding the display layer DSL, the encapsulation layer EN and the cover film CP, in convenience.

The lower surface DNS may be a stepped surface having level difference, so overall area of the lower surface is not coplanar. That is, some portions may have a different thickness from other portions. The first bending part 210 and the second bending part 310 may be thinner than the reference plane 100. Further, the first folding plane 200 may have thinner thickness than the reference plane 100.

Forming the first bending part 210 and the second bending part 310 to have different thicknesses, the neutral plane of the first bending part 210 and the neutral plane the second bending part 310 may be set at different position each other. As the result, the bending stress or the folding stress at each bending part may be minimized, the reliability of folding state may be enhanced. By making the thicknesses of the bending parts be thinner than other portions, the modulus of the bending parts may be adjusted lower than other portions having the modulus of the original thickness. Accordingly, the bending stresses at the bending parts may be relieved.

Hereinafter, various embodiments of forming the folding frame FF to have different thicknesses will be described. In the following embodiments, the explanation will be described in the view of the thickness variations of the folding frame FF which is a core configuration for implementing the G-folding structure.

First Embodiment

Figure 3:
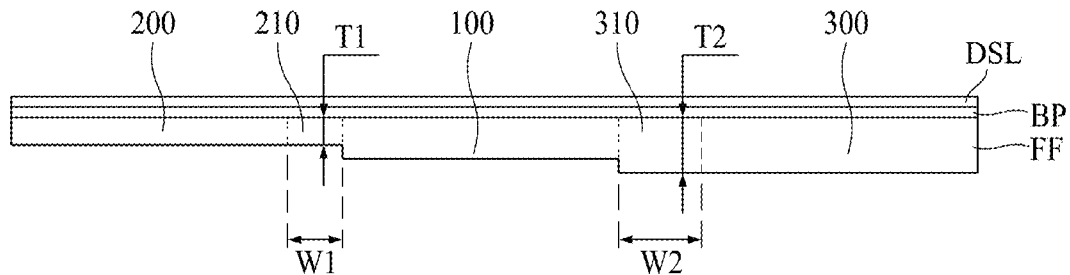
FIG. 3 is a cross-sectional view illustrating a structure of a folding frame of a foldable display according to a first embodiment of the present disclosure.

Hereinafter, referring to FIG. 3, a structure of a folding frame according to the first embodiment of the present disclosure will be explained. FIG. 3 is a cross-sectional view illustrating a folding frame structure of a foldable display according to the first embodiment of the present disclosure.

The foldable display according to the first embodiment of the present disclosure may comprise a display layer DSL, a back plate BP and a folding frame FF. The display layer DSL may include a thin film transistor layer and an emission layer formed on a flexible substrate FS, an encapsulation layer EN covering the thin film transistor layer and the emission layer, and a cover film CP stacked over the encapsulation layer EN. The back plate BP may be a base film attached on the bottom surface of the flexible substrate. The folding frame FF may be a functional film attached on the bottom surface of the back plate BP to enhance the folding and unfolding operations. For the reference numerals not shown in the FIG. 3, the same reference numerals shown in FIGS. 1A, 1B and 2, may be referred to.

The display layer DSL and the back plate BP may have a constant thickness, respectively. The foldable display according to the first embodiment of the present disclosure may have a structural feature in which the folding and unfolding operations are enhanced by adjusting the thicknesses of the folding frame FF differently in desired portions.

The folding frame FF according to the first embodiment of the present disclosure may include a reference frame 100, a first folding plane 200, a second folding plane 300, a first bending part 210 and a second bending part 310. The first bending part 210 may have a first width W1 and a first thickness T1. The second bending part 310 may have a second width W2 and a second thickness T2. The second thickness T2 may thicker than the first thickness T1.

The first folding plane 200 may have a thickness same with the first thickness T1. The reference plane 100 may have a thickness thicker than the first thickness T1 and thinner than the second thickness T2. The second folding plane 300 may have a thickness same with the second thickness T2.

By setting the thickness of the folding frame FF differently for each part, the thickness of the entire display may be set differently for each part. In particular, by setting the thickness of the bending part nd the flat part differently, the neutral plane may be adjusted differently so that the bending stress at the bending part may be relieved effectively. Accordingly, the folding and unfolding operations may be enhanced.

Second Embodiment

Figure 4:
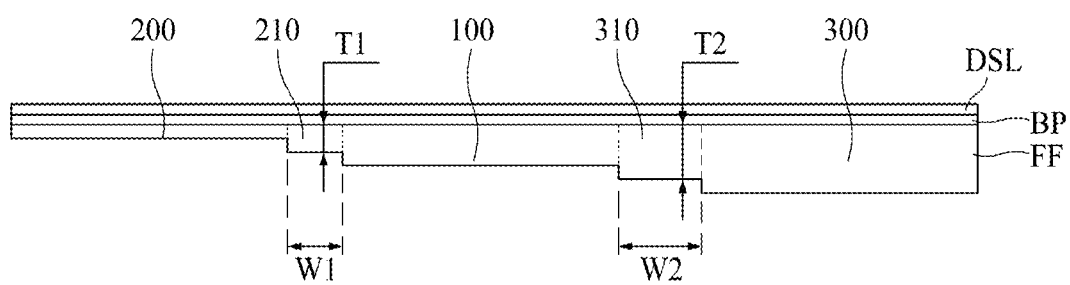
FIG. 4 is a cross-sectional view illustrating a structure of a folding frame of a foldable display according to a second embodiment of the present disclosure.

Hereinafter, referring to FIG. 4, a structure of a folding frame according to the second embodiment of the present disclosure will be explained. FIG. 4 is a cross-sectional view illustrating a folding frame structure of a foldable display according to the second embodiment of the present disclosure.

The foldable display according to the second embodiment of the present disclosure may comprise a display layer DSL, a back plate BP and a folding frame FF. The display layer DSL may include a thin film transistor layer and an emission layer formed on a flexible substrate, an encapsulation layer covering the thin film transistor layer and the emission layer, and a cover film stacked over the encapsulation layer. The back plate BP may be a base film attached on the bottom surface of the flexible substrate. The folding frame FF may be a functional film attached on the bottom surface of the back plate BP to enhance the folding and unfolding operations.

The display layer DSL and the back plate BP may have a constant thickness, respectively. The foldable display according to the second embodiment of the present disclosure may have a structural feature in which the folding and unfolding operations are enhanced by adjusting the thicknesses of the folding frame FF differently in desired portions.

The folding frame FF according to the second embodiment of the present disclosure may include a reference frame 100, a first folding plane 200, a second folding plane 300, a first bending part 210 and a second bending part 310. The first bending part 210 may have a first width W1 and a first thickness T1. The second bending part 310 may have a second width W2 and a second thickness T2. The second thickness T2 may be thicker that the first thickness T1.

The first folding plane 200 may be thinner than the first thickness T1. The reference plane 100 may be thicker than the first thickness T1 and thinner than the second thickness T2. The second folding plane 300 may be thicker than the second thickness T2.

By setting the thickness of the folding frame FF differently for each part, the thickness of the entire display may be set differently for each part. In particular, by setting the thickness of the bending part nd the flat part differently, the neutral plane may be adjusted differently so that the bending stress at the bending part may be relieved effectively. Accordingly, the folding and unfolding operations may be enhanced.

Third Embodiment

Figure 5:
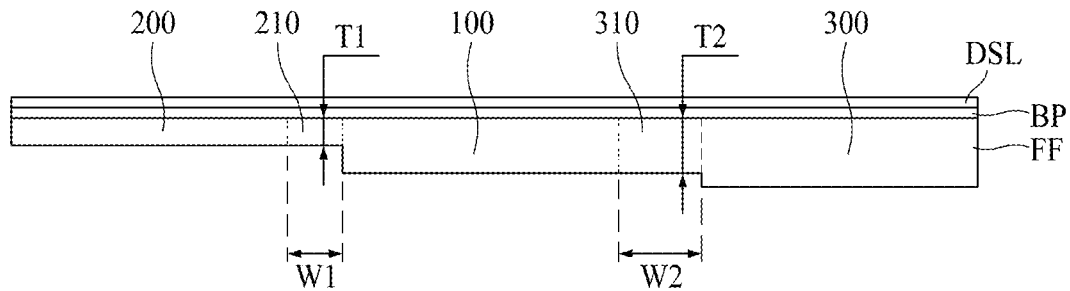
FIG. 5 is a cross-sectional view illustrating a structure of a folding frame of a foldable display according to a third embodiment of the present disclosure.

Hereinafter, referring to FIG. 5, a structure of a folding frame according to the third embodiment of the present disclosure will be explained. FIG. 5 is a cross-sectional view illustrating a folding frame structure of a foldable display according to the third embodiment of the present disclosure.

The foldable display according to the third embodiment of the present disclosure may comprise a display layer DSL, a back plate BP and a folding frame FF. The display layer DSL may include a thin film transistor layer and an emission layer formed on a flexible substrate, an encapsulation layer covering the thin film transistor layer and the emission layer, and a cover film stacked over the encapsulation layer. The back plate BP may be a base film attached on the bottom surface of the flexible substrate. The folding frame FF may be a functional film attached on the bottom surface of the back plate BP to enhance the folding and unfolding operations.

The display layer DSL and the back plate BP may have a constant thickness, respectively. The foldable display according to the third embodiment of the present disclosure may have a structural feature in which the folding and unfolding operations are enhanced by adjusting the thicknesses of the folding frame FF differently in desired portions.

The folding frame FF according to the third embodiment of the present disclosure may include a reference frame 100, a first folding plane 200, a second folding plane 300, a first bending part 210 and a second bending part 310. The first bending part 210 may have a first width W1 and a first thickness T1. The second bending part 310 may have a second width W2 and a second thickness T2. The second thickness T2 may be thicker than the first thickness T1.

The first folding plane 200 may have a thickness same with the first thickness T1. The reference plane 100 may have a thickness same with the second thickness T2. The second folding plane 300 may be thicker than the second thickness T2.

By setting the thickness of the folding frame FF differently for each part, the thickness of the entire display may be set differently for each part. In particular, by setting the thickness of the bending part nd the flat part differently, the neutral plane may be adjusted differently so that the bending stress at the bending part may be relieved effectively. Accordingly, the folding and unfolding operations may be enhanced.

Fourth Embodiment

Figure 6:
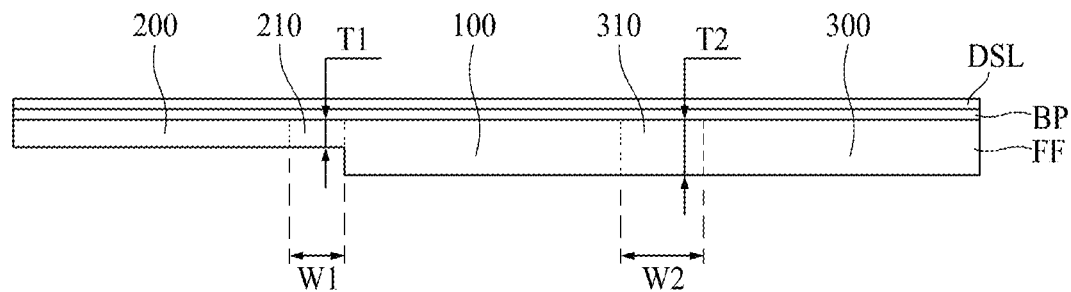
FIG. 6 is a cross-sectional view illustrating a structure of a folding frame of a foldable display according to a fourth embodiment of the present disclosure.

Hereinafter, referring to FIG. 6, a structure of a folding frame according to the fourth embodiment of the present disclosure will be explained. FIG. 5 is a cross-sectional view illustrating a folding frame structure of a foldable display according to the fourth embodiment of the present disclosure.

The foldable display according to the fourth embodiment of the present disclosure may comprise a display layer DSL, a back plate BP and a folding frame FF. The display layer DSL may include a thin film transistor layer and an emission layer formed on a flexible substrate, an encapsulation layer covering the thin film transistor layer and the emission layer, and a cover film stacked over the encapsulation layer. The back plate BP may be a base film attached on the bottom surface of the flexible substrate. The folding frame FF may be a functional film attached on the bottom surface of the back plate BP to enhance the folding and unfolding operations.

The display layer DSL and the back plate BP may have a constant thickness, respectively. The foldable display according to the fourth embodiment of the present disclosure may have a structural feature in which the folding and unfolding operations are enhanced by adjusting the thicknesses of the folding frame FF differently in desired portions.

The folding frame FF according to the fourth embodiment of the present disclosure may include a reference frame 100, a first folding plane 200, a second folding plane 300, a first bending part 210 and a second bending part 310. The first bending part 210 may have a first width W1 and a first thickness T1. The second bending part 310 may have a second width W2 and a second thickness T2. The second thickness T2 may be thicker than the first thickness T1.

The first folding plane 200 may have a thickness same with the first thickness T1. The reference plane 100 may have a thickness same with the second thickness T2. The second folding plane 300 may be thicker than the second thickness T2. That is, the reference plane 100, the second bending part 310 and the second folding plane 300 may have the same thickness as the second thickness T2.

By setting the thickness of the folding frame FF differently for each part, the thickness of the entire display may be set differently for each part. In particular, by setting the thickness of the bending part nd the flat part differently, the neutral plane may be adjusted differently so that the bending stress at the bending part may be relieved effectively. Accordingly, the folding and unfolding operations may be enhanced.

Fifth Embodiment

Figure 7:
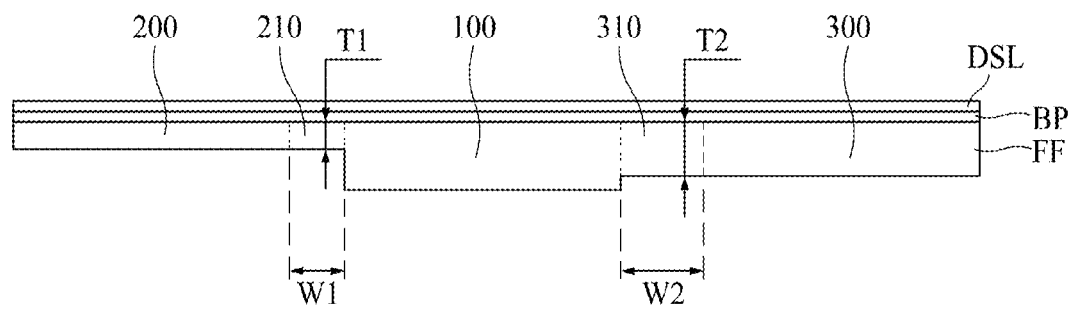
FIG. 7 is a cross-sectional view illustrating a structure of a folding frame of a foldable display according to a fifth embodiment of the present disclosure.

Hereinafter, referring to FIG. 7, a structure of a folding frame according to the fifth embodiment of the present disclosure will be explained. FIG. 7 is a cross-sectional view illustrating a folding frame structure of a foldable display according to the fifth embodiment of the present disclosure.

The foldable display according to the fifth embodiment of the present disclosure may comprise a display layer DSL, a back plate BP and a folding frame FF. The display layer DSL may include a thin film transistor layer and an emission layer formed on a flexible substrate, an encapsulation layer covering the thin film transistor layer and the emission layer, and a cover film stacked over the encapsulation layer. The back plate BP may be a base film attached on the bottom surface of the flexible substrate. The folding frame FF may be a functional film attached on the bottom surface of the back plate BP to enhance the folding and unfolding operations.

The display layer DSL and the back plate BP may have a constant thickness, respectively. The foldable display according to the fifth embodiment of the present disclosure may have a structural feature in which the folding and unfolding operations are enhanced by adjusting the thicknesses of the folding frame FF differently in desired portions.

The folding frame FF according to the fifth embodiment of the present disclosure may include a reference frame 100, a first folding plane 200, a second folding plane 300, a first bending part 210 and a second bending part 310. The first bending part 210 may have a first width W1 and a first thickness T1. The second bending part 310 may have a second width W2 and a second thickness T2. The second thickness T2 may be thicker than the first thickness T1.

The first folding plane 200 may have a thickness same with the first thickness T1. The reference plane 100 may be thicker than the second thickness T2. The second folding plane 300 may have a thickness same with the second thickness T2. That is, the reference plane 100 may have the thickest thickness. Further, the first folding plane 200 and the first bending part 210 may have the first thickness T1, the thinnest thickness. The second folding plane 300 and the second bending part 310 may have the second thickness T2 which is thicker than the first thickness T1 and thinner than the reference plane 100.

By setting the thickness of the folding frame FF differently for each part, the thickness of the entire display may be set differently for each part. In particular, by setting the thickness of the bending part nd the flat part differently, the neutral plane may be adjusted differently so that the bending stress at the bending part may be relieved effectively. Accordingly, the folding and unfolding operations may be enhanced.

Sixth Embodiment

Figure 8:
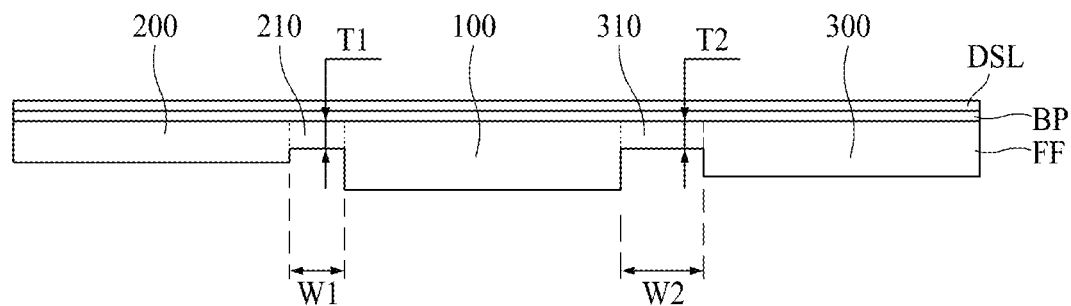
FIG. 8 is a cross-sectional view illustrating a structure of a folding frame of a foldable display according to a sixth embodiment of the present disclosure.

Hereinafter, referring to FIG. 8, a structure of a folding frame according to the sixth embodiment of the present disclosure will be explained. FIG. 8 is a cross-sectional view illustrating a folding frame structure of a foldable display according to the sixth embodiment of the present disclosure.

The foldable display according to the sixth embodiment of the present disclosure may comprise a display layer DSL, a back plate BP and a folding frame FF. The display layer DSL may include a thin film transistor layer and an emission layer formed on a flexible substrate, an encapsulation layer covering the thin film transistor layer and the emission layer, and a cover film stacked over the encapsulation layer. The back plate BP may be a base film attached on the bottom surface of the flexible substrate. The folding frame FF may be a functional film attached on the bottom surface of the back plate BP to enhance the folding and unfolding operations.

The display layer DSL and the back plate BP may have a constant thickness, respectively. The foldable display according to the sixth embodiment of the present disclosure may have a structural feature in which the folding and unfolding operations are enhanced by adjusting the thicknesses of the folding frame FF differently in desired portions.

The folding frame FF according to the sixth embodiment of the present disclosure may include a reference frame 100, a first folding plane 200, a second folding plane 300, a first bending part 210 and a second bending part 310. The first bending part 210 may have a first width W1 and a first thickness T1. The second bending part 310 may have a second width W2 and a second thickness T2. The second thickness T2 may be equal to or thicker than the first thickness T1.

The first folding plane 200 may be thicker than the first thickness T1. The reference plane 100 may be thicker than the first thickness T1 and the second thickness T2. The second folding plane 300 may be thickener than the second thickness T2. The reference plane 100 may be thicker than the first folding plane 200 and the second folding plane 300. Further, the second folding plane 300 may be thicker than the first folding plane 200.

By setting the thickness of the folding frame FF differently for each part, the thickness of the entire display may be set differently for each part. In particular, by setting the thickness of the bending part nd the flat part differently, the neutral plane may be adjusted differently so that the bending stress at the bending part may be relieved effectively. Accordingly, the folding and unfolding operations may be enhanced.

The foldable display according to the various embodiments of the present disclosure may comprise the first bending part and the second bending part having different curvature each other. By setting the different thicknesses to the parts of the folding frame having different curvatures, the position of the neutral plane may be defined depending on the different curvatures. Further, the modulus of the folding frame may be adjusted differently at each region. Accordingly, the bending stress or folding stress at each bending part may be minimized, and the reliability of the folding and unfolding operations may be improved. In order to change the thickness of the folding frame at each part, the thickness may be easily adjusted by using a cutting/carving method in which the folding frame FF is cut or carver. In addition, as the emitted light from the emission element may be radiated to the opposite surface to the folding frame FF, the thickness variations of the folding frame FF may not affect to the light efficiency at all.

Features, structures, effects and so on described in the above described examples of the present disclosure are included in at least one example of the present disclosure, and are not necessarily limited to only one example. Furthermore, features, structures, effects and so on exemplified in at least one example of the present disclosure may be implemented by combining or modifying other examples by a person having ordinary skilled in this field. Therefore, contents related to such combinations and modifications should be interpreted as being included in the scope of the present application.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A folding frame for a foldable display comprising:
a lower surface;
a reference plane including an upper surface having a flat condition;
a first folding plane disposed at one side of the reference plane;
a second folding plane disposed at another side of the reference plane;
a first bending part disposed between the reference plane and the first folding plane, the first bending part having a first bending radius and a first uniform thickness; and
a second bending part disposed between the reference plane and the second folding plane, the second bending part having a second bending radius and a second uniform thickness,
wherein the first folding plane is thinner than the reference plane,
wherein, in a folded state, the upper surface of the reference plane is between the first folding plane and the reference plane, and between the second folding plane and the reference plane,
wherein, in an unfolded state:
the lower surface is provided with at least one step having an exposed side wall at an intersection;
the exposed side wall is perpendicular to the lower surface at the intersection; and
the intersection is an intersection of the first folding plane and the first bending part, an intersection of the first bending part and the reference plane, an intersection of the reference plane and the second bending part, or an intersection of the second bending part and the second folding plane, and
wherein the folding frame is configured as one unitary film body.

2. The folding frame according to claim 1, wherein:
the lower surface is parallel with the upper surface and level differences;
a back plate is attached to the upper surface with an optical adhesive.

3. The folding frame according to claim 1, wherein the first folding plane is thinner than the second folding plane.

4. The folding frame according to claim 1, wherein the first folding plane is equal to or thinner than the first uniform thickness, and
   wherein the second folding plane is equal to or thicker than the second uniform thickness.

5. The folding frame according to claim 1, wherein the first folding plane is thinner than the first uniform thickness,
   wherein the reference plane is thicker than the first uniform thickness,
   wherein the second uniform thickness is thicker than the reference plane, and
   wherein the second folding plane is thicker than the second uniform thickness.

6. The folding frame according to claim 1, wherein a thickness of the first folding plane is equal to the first uniform thickness,
   wherein a thickness of the reference plane is equal to the second uniform thickness, and
   wherein the second folding plane is thicker than the second uniform thickness.

7. The folding frame according to claim 1, wherein a thickness of the first folding plane is equal to the first uniform thickness, and
   wherein a thickness of the reference plane and the second folding plane are equal to the second uniform thickness.

8. The folding frame according to claim 1, wherein a thickness of the first folding plane is equal to the first uniform thickness,
   wherein a thickness of the second folding plane is equal to the second uniform thickness, and
   wherein the reference plane is thicker than the second uniform thickness.

9. The folding frame according to claim 1, wherein the first folding plane, the reference plane and the second folding plane are thicker than the first uniform thickness and the second uniform thickness.

10. The folding frame according to claim 1, wherein the first folding plane is folded over the reference plane, and
    wherein the second folding plane is folded over the first folding plane.

11. The folding frame according to claim 1, wherein the at least one step is formed by removing at least a portion of the folding frame.

12. The folding frame according to claim 1, wherein:
    each of the entire first folding plane, the entire reference plane, and the entire second folding plane has a uniform thickness; and
    at least two of the first folding plane, the reference plane, and the second folding plane have different thicknesses.

13. The folding frame according to claim 1, wherein:
    the exposed side wall is an integral side wall;
    the exposed side wall is an integral part of the one film body of the folding frame; and
    the exposed side wall is a straight, flat surface.

14. The folding frame according to claim 1, wherein the intersection for the exposed side wall is the intersection of the first bending part and the reference plane.

15. The folding frame according to claim 14, wherein the lower surface is provided with a second step having a second wall at the intersection of the reference plane and the second bending part.

16. A foldable display comprising:
    a folding frame, configured as one unitary film body, including:
    an upper surface being coplanar;
    a lower surface parallel to the upper surface, the lower surface having level differences;
    a first bending part having a first width on the lower surface and a first uniform thickness;
    a second bending part being apart from the first bending part, the second bending part having a second width larger than the first width on the lower surface and a second uniform thickness;
    a reference plane between the first bending part and the second bending part;
    a first folding plane expanded from the first bending part to opposite side of the reference plane; and
    a second folding plane expanded from the second bending part to opposite side of the reference plane,
    wherein a thickness of the reference plane is thicker than a thickness of the first folding plane and the first uniform thickness,
    wherein a thickness of the second folding plane is thicker than the thickness of the first folding plane and the first uniform thickness,
    wherein, in a folded state:
    the upper surface at the second folding plane faces the lower surface at the first folding plane,
    the upper surface at the first folding plane faces the upper surface at the reference plane, and
    wherein, in an unfolded state:
    the lower surface is provided with at least one step having an exposed side wall at an intersection;
    the exposed side wall is perpendicular to the lower surface at the intersection; and
    the intersection is an intersection of the first folding plane and the first bending part, an intersection of the first bending part and the reference plane, an intersection of the reference plane and the second bending part, or an intersection of the second bending part and the second folding plane.

17. The foldable display according to claim 16, further comprising:
    a back plate disposed on the upper surface of the folding frame;
    a flexible substrate disposed on the back plate;
    a display layer disposed on the flexible substrate;
    an encapsulation layer covering the display layer; and
    a cover film disposed on the encapsulation layer.

18. The foldable display according to claim 16, wherein a thickness of the second bending part is equal to or thicker than the first uniform thickness.

19. The foldable display according to claim 16, wherein a thickness of the first folding plane is equal to or thinner than the first uniform thickness, and
    wherein a thickness of the second folding plane is equal to or thicker than the second uniform thickness.

20. The foldable display according to claim 16, wherein the first folding plane is thinner than the first uniform thickness,
    wherein the reference plane is thicker than the first uniform thickness,
    wherein the second uniform thickness is thicker than the thickness of the reference plane, and
    wherein the second folding plane is thicker than the second uniform thickness.

21. The foldable display according to claim 16, wherein a thickness of the first folding plane is equal to the first uniform thickness,
    wherein a thickness of the reference plane is equal to the second uniform thickness, and wherein the second folding plane is thicker than the second uniform thickness.

22. The foldable display according to claim 16, wherein a thickness of the first folding plane is equal to the first uniform thickness, and
wherein thicknesses of the reference plane and the second folding plane are equal to the second uniform thickness.

23. The foldable display according to claim 16, wherein a thickness of the first folding plane is equal to the first uniform thickness,
wherein a thickness of the second folding plane is equal to the second uniform thickness, and
wherein the reference plane is thicker than the second uniform thickness.

24. The foldable display according to claim 16, wherein the first folding plane, the reference plane and the second folding plane are thicker than the first uniform thickness and the second uniform thickness.

25. The foldable display according to claim 16, wherein the first bending part is bent and the first folding plane is folded over the reference plane, and
wherein the second bending part is bent and the second folding plane is folded on the first folding plane.

* * * * *